United States Patent [19]

Nagashima

[11] Patent Number: 5,604,703
[45] Date of Patent: Feb. 18, 1997

[54] SEMICONDUCTOR MEMORY DEVICE WITH ERROR CHECK-CORRECTION FUNCTION PERMITTING REDUCED READ-OUT TIME

[75] Inventor: Hirokazu Nagashima, Tokyo, Japan

[73] Assignee: NEC Corporation, Tokyo, Japan

[21] Appl. No.: 546,983

[22] Filed: Oct. 23, 1995

[30]  Foreign Application Priority Data

Oct. 24, 1994  [JP]  Japan .................................. 6-257814

[51] Int. Cl.$^6$ .................................................. G06F 11/00
[52] U.S. Cl. .................. 365/200; 365/189.05; 371/40.1; 371/20.1
[58] Field of Search ............................ 365/200, 189.05, 365/189.07; 371/5.1, 21.1, 40.1, 40.2

[56]  References Cited

U.S. PATENT DOCUMENTS 5,195,099  3/1993  Ueda et al. .................. 365/200
5,233,610  8/1993  Nakayama et al. .................. 365/200

Primary Examiner—David C. Nelms
Assistant Examiner—Vu A. Le
Attorney, Agent, or Firm—Foley & Lardner

[57]  ABSTRACT

A semiconductor memory device, in which in each unit circuit of a data output circuit, a resistor is connected to an input terminal of an inverter for performing a buffering amplification, and a transfer gate is turned on (closed) to short-circuit both ends of the resistor so as to pass corrected data output from an error correction circuit not via the resistor but directly to the inverter when a bit corresponding to an error check signal output from an error check circuit has an active level, resulting in a reduced time for outputting the corrected data.

5 Claims, 6 Drawing Sheets

SEMICONDUCTOR MEMORY DEVICE WITH ERROR CHECK-CORRECTION FUNCTION PERMITTING REDUCED READ-OUT TIME

BACKGROUND OF THE INVENTION

The present invention relates to a semiconductor memory device, and more particularly, to a semiconductor memory device with an error check-correction (hereafter "ECC") function permitting a data read-out time to be reduced.

Description of the Related Art

In recent years, the semiconductor memory device has an increased capacity, with a corresponding probability of a presence of a defective memory cell so that a compensation technique is needed. As an implementation of such the compensation technique, measures for an ECC of parallel bits of data to be read out have been proposed. FIG. 1 shows a conventional semiconductor memory device with an ECC function in a read-out system thereof.

As shown in FIG. 1, the conventional semiconductor memory device comprises a matrix-addressed memory cell array (hereafter "first memory") 1, another matrix-addressed memory cell array (hereafter "second memory") 2, a column data selection circuit (hereafter "first selection circuit") 3a connected to the first memory 1, another column data selection circuit (hereafter "second selection circuit") 3b connected to the second memory 2, a sense amplifying circuit 4 connected to the first and second selection circuits 3a and 3b, an error check circuit 5 connected to the sense amplifying circuit 4, an error correction circuit 6 connected to the sense amplifying circuit 4 and the error check circuit 5, and a data output circuit 7x.

The first memory 1 stores therein a set of given data each consisting of n bits, where n is a predetermined integer such that $n \geq 1$. The second memory 2 stores therein a set of ECC data each consisting of m check bits, where m is a predetermined integer such that $2^m - 1 \geq n$). The ECC data are generated as m-bit data at an input end of the first memory 1 in a one-to-one correspondent manner to the given n-bit data, and stored in the second memory 2 for use in an ECC of the n-bit data at an output end of the first memory 1. Any m-bit data is stored at an address in the second memory 2 that corresponds to an address in the first memory 1, where an n-bit data corresponding to the m-bit data is stored, so that address of the m-bit data may be identical in row and column of memory cells to that of the n-bit data.

When an address signal is input to the memory device, those n-bit data stored in a row (in the first memory 1) designated by the address signal are read to be sent to the first selection circuit 3a, and those m-bit data stored in a row (in the second memory 2) corresponding to the designated row are read to be sent to the second selection circuit 3a.

The first selection circuit 3a selects one of the n-bit data sent thereto, which has been read from a column (in the first memory 1) designated by the address signal. Likewise, the second selection circuit 3b selects one of the m-bit data sent thereto, which has been read from a column (in the second memory 2) corresponding to the designated column, so that the selected m-bit data has necessary information for the ECC of the selected n-bit data.

The sense amplifying circuit 4 detects levels of respective parallel bits of the n-bit data selected by the first selection circuit 3a and of the m-bit data selected by the second selection circuit 3b, and amplifies the m+n detected bit levels to output n reshaped parallel data bits Dr1 to Drn and m reshaped parallel check bits C1 to Cm.

The error check circuit 5 is responsible for a former half of the ECC function so that the m parallel check bits C1 to Cm are employed to check the n parallel data bits Dr1 to Drn for an erroneous logical value, by executing a logic operation therebetween that provides n parallel logical results represented by n error check signals as level signals E1 to En, which all has an inactive level when the n parallel data bits Dr1 to Drn are all correct and of which an i-th one Ei has an active level if an i-th one Dri of the n data bits Dr1 to Drn is incorrect, where i is an arbitrary integer between 1 and n, both inclusive. Two or more of the n error check signals E1 to En may concurrently have the active level.

The error correction circuit 6 is responsible for a latter half of the ECC function so that an exclusive logical sum (hereafter "EXOR") is determined between a respective one Dri of the n data bits Dr1 to Brn and a corresponding one Ei of the n error check signals E1 to En to thereby provide a data bit BCi equivalent to a corresponding i-th bit in the given data, i.e. to provide a correct data bit Dci, as it is corrected from a corresponding incorrect bit Dri when a corresponding error check signal Ei is at the active level. The error correction circuit 6 comprises n EXOR gates G61 to G6n, of which an i-th one G6i receives an i-th amplified data bit Dri at an input terminal thereof and an i-th error check signal Ei at another input terminal thereof and provides an i-th correct data bit Dci at an output terminal thereof. As a result, n correct data bits Dc1 to Dcn are output in parallel from the error correction circuit 6 to the data output circuit 7x.

The data output circuit 7x comprises n unit circuits 71x to 7nx of which a respective one 7ix is composed of a resistor Ri connected to the output terminal of a corresponding EXOR gate G6i and an inverter IVi coupled with the resistor Ri in series for performing a buffering amplification of a corresponding one Dci of the n correct data bits Dc1 to Dcn to output a corresponding one Doi of n parallel bits Do1 to Don of a data to be output as the read data from the designated column in the designated row of the memory cell array 1. In the example, each inverter IVi is composed of a p-channel MOS-FET and an n-channel MOS-FET connected in series between a power supply conductor and a ground level, to receive an input Dci thereto at their gate electrodes and to output a corresponding data bit Doi from an interconnection therebetween.

Functions of the conventional semiconductor memory device will be additionally described with reference to FIGS. 1 and 2. FIG. 2 shows time charts of associated signals.

Designated at reference character AD is the address signal, which consists of a row address signal and a column address signal. When the address signal AD is input or changed to designate an address defined by a combination of a row and a column in an address matrix, the row is designated by the row address signal and the column is designated by the column address signal, so that an array of n-bit data in the designated row in the first memory 1 and an array of m-bit data in the designated row in the second memory 2 are read and, among them, an n-bit data read from the designated column in the first memory 1 and an m-bit data read from the designated column in the second memory 2 are selected by the first and second selection circuits 3a and 3b, respectively.

The selected n-bit data and the selected m-bit data are input to the sense amplifying circuit 4, where n bits of the former data have their levels detected and amplified to be output as the n data bits Dr1 to Drn to the error check circuit 5 and the error correction circuit 6, and m bits of the latter data have their levels detected and amplified to be output as the m check bits C1 to Cn to the error check circuit 5.

The error check circuit 5 comprises logic circuitry, as exemplarily shown in FIG. 3 for a simplified case such that n=4 and m=3. In the case of FIG. 3, the logic circuitry comprises m EXOR gates G5j (j is an arbitrary integer between 1 and m, both inclusive), m inverters IV5j connected to the EXOR gates G5j, n NAND gates G8i connected to the EXOR gates G5j and the inverters IV5j, and n inverters IV8i connected to the NAND gates G8i.

As shown in FIG. 3, m different combinations among n data bits Dri and m check bits Cj are input to the m EXOR gates G5j, respectively, where respective values of the n data bits Dri are logically checked by determining respective EXORs of the m combinations, of which results are output as m syndromes Sj. Then, as in FIG. 3, n different combinations among the m syndromes Sj and inverted values thereof via the m inverters IV5j are input to n gate circuits composed of the NAND gates G8i followed by the inverters IV8i, respectively, where their NANDs are negated to provide the n error check signals Ei, of which a respective one Ei has, as shown in FIG. 2, the inactive level when a corresponding data bit Dri is correct or the active level if the corresponding data bit Dri (i=1 in FIG. 2) is erroneous.

In the error correction circuit 6, n combinations between a respective one of the n data bits Dri and a corresponding one of the n error check signals Ei are EXORed by the n gates G6i to provide the n data bits Dci, respectively, so that any erroneous data bit Dri (i=1 in FIG. 2) is corrected by the corresponding error check signal Ei which has the active level, ensuring the n data bits Dci to be all correct. In other words, each non-erroneous data bit Dri is let through the correction circuit 6, to be output as it is as a corresponding correct data bit Dci, and any erroneous data bit Dri is corrected (i.e. level-inverted) at the correction circuit 6, to be output as a corresponding correct data bit Dci.

The n correct data bits Dci are input in parallel to the n unit circuits 7ix of the data output circuit 7x, and conducted through the resistors Ri, where they are delayed in dependence on a resistance of the resistors Ri, to the inverters IVi, where they are inverted to be output as parallel n bits Doi of a read-out data.

In each unit circuit 7ix of the data output circuit 7x, the inverter IVi is driven to have its load capacity charge and discharge, causing an associated current to be conducted, so that it has a current drivability which causes, in the case of an inverter IVi of a CMOS type, a corresponding current to run through the inverter IVi when a bit level is changed. Therefore, some conductors such as a common power supply line and a common ground line are subjected to a sum of such currents that amounts to a relatively large current if n is large (i.e. in a case of multiple parallel bits), thus causing a relatively large voltage drop, with an increased probability of an erroneous action in the semiconductor device.

To avoid such a problem, the resistor Ri is connected as a power supply current reduction means at an input end of the inverter IVi, with desirable effects such as a reduced speed and a shifted timing of bit level transition as well as a suppressed current conduction to achieve a controlled peak of a power supply current.

Thus, in the conventional semiconductor memory device, the data output circuit 7x for outputtting a read data is provided with a power supply current reduction means for moderating a bit level change after an erroneous one of n bits in the read data from the first memory 1 is corrected by an error check signal Ei generated by a logic operation between n bits of the read data and m bits of a corresponding ECC data read from the second memory 2.

However, the provision of such a current reduction means accompanies an elongated interval of time before a corrected bit is output.

The present invention has been achieved with such points in mind.

SUMMARY OF THE INVENTION

Therefore, it is an object of the present invention to provide a semiconductor memory device, permitting a reduced time interval to be taken before a corrected bit is output.

To achieve the object, a genus of the present invention provides a semiconductor memory device comprising a first memory, a second memory, a data reading means, an error check means, an error correction means, and a data output circuit composed of n buffer circuits, a power supply current reduction means and a current reduction control means.

The first memory stores therein a set of n-bit data, where n is a predetermined integer such that $n \geq 1$. The second memory stores therein a set of m-bit data of which a respective one is prepared for use in a checking operation for checking n bits of a corresponding one of the n-bit data for an erroneous bit and a correcting operation for correcting the erroneous bit, where m is a predetermined integer. The data reading means reads the respective m-bit data and the corresponding n-bit data. The error check means performs the checking operation to provide an error check signal. The error correction means is responsive to the error check signal to perform the correcting operation to provide n correct bits of which a correspondent one to the erroneous bit is corrected. In the data output circuit, the n buffer circuits perform a buffering amplification of the n correct bits, conducting a power supply current, respectively, the power supply current reduction means performs a reduction of the power supply current for the buffering amplification of a respective one of the n correct bits, and the current reduction control means is responsive to the error check signal to control the reduction of the power supply current for the buffering amplification of the corrected bit.

According to the genus of the invention, a data output circuit is equipped with a power supply current reduction control means which controls a reduction of a power supply current when an error bit is corrected, so that a data output time dependent on the current reduction is controlled.

Moreover, to achieve the object, another genus of the the present invention provides a semiconductor memory device, comprising a first memory cell array for storing n-bit data into given addresses, a second memory cell array for storing predetermined-bit check bits corresponding to the n-bit data to be stored in the first memory cell array into the corresponding addresses, an error check circuit which performs a predetermined logic operation of the n-bit data and the corresponding check bits read out of the first and second memory cell arrays, checks the n-bit data to find an error bit therein and changes a level of the error bit to an active level to output error check signals, an error correction circuit for correcting only the error bit of the n-bit data according to the error check signals to output the corrected n-bit data, and a data output circuit for performing a buffering amplification of the corrected n-bit data every bit to output parallel bits of amplified n-bit data, the data output circuit including, reduction means for reducing a power supply current with the parallel output of the n-bit data, and invalidation means for invalidating the reduction means of the power supply current corresponding to a bit having an active level of the error check signal.

According to a species of this genus of the invention, the data output circuit preferably includes n unit circuits for processing the n-bit data, each unit circuit including an inverter for performing the buffering amplification of the respective data to output the amplified data, a resistor as the reduction means connected to an input terminal of the inverter for moderating a level change of the input data, and a transfer gate as the invalidation means for short-circuiting the resistor when the bit corresponding to the error check signal has the active level.

According to another species of this genus of the invention, the data output circuit preferably includes n unit circuits for processing the n-bit data, each unit circuit including a first inverter having a first predetermined current drivability for performing the buffering amplification of the respective data to output the amplified data, a second inverter as the reduction means connected to an input terminal of the first inverter for moderating a level change of the data to be input to the first inverter, the second inverter having a second predetermined current drivability which is lower than the first predetermined current drivability of the first inverter, and a transfer gate as the invalidation means for passing the data not via the second inverter but directly to the first inverter when the bit corresponding to the error check signal has the active level.

According to this genus of the invention, each unit circuit of a data output circuit is equipped with a power current reduction invalidation means which invalidates a function of a power current reduction means when the bit corresponding to an error check signal has an active level so that a data output from an error correction circuit does not pass through the power supply current reduction means and is directly input to an output inverter. As a result, the time for outputting the corrected data is reduced.

BRIEF DESCRIPTION OF THE DRAWINGS

The objects, features and advantages of the present invention will become more apparent from the consideration of the following detailed description, taken in conjunction with the accompanying drawings, in which.

DESCRIPTION OF THE PREFERRED EMBODIMENTS

Figure 4:
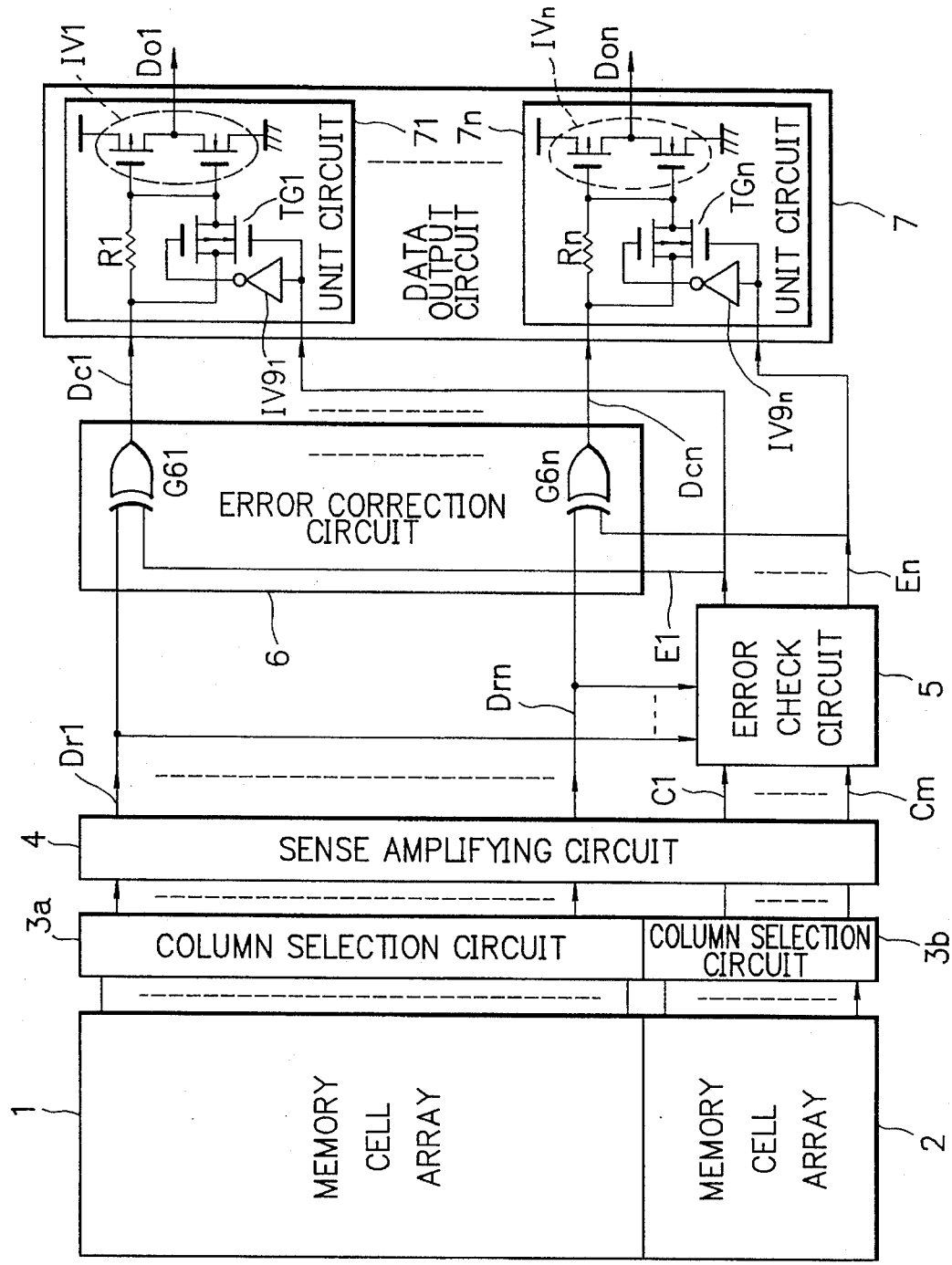
FIG. 4 is a block diagram of a first embodiment of a semiconductor memory device according to the present invention.

Referring to FIG. 4, there is shown a semiconductor memory device according to a first embodiment of the present invention. Like members to FIG. 1 are designated at like reference characters.

The semiconductor memory device of FIG. 4 comprises a first memory cell array 1, a second memory cell array 2, a first column selection circuit 3a, a second column selection circuit 3b, a sense amplifying circuit 4, an error check circuit 5, an error correction circuit 6, and a data output circuit 7 including n unit circuits 71 to 7n.

Figure 1:
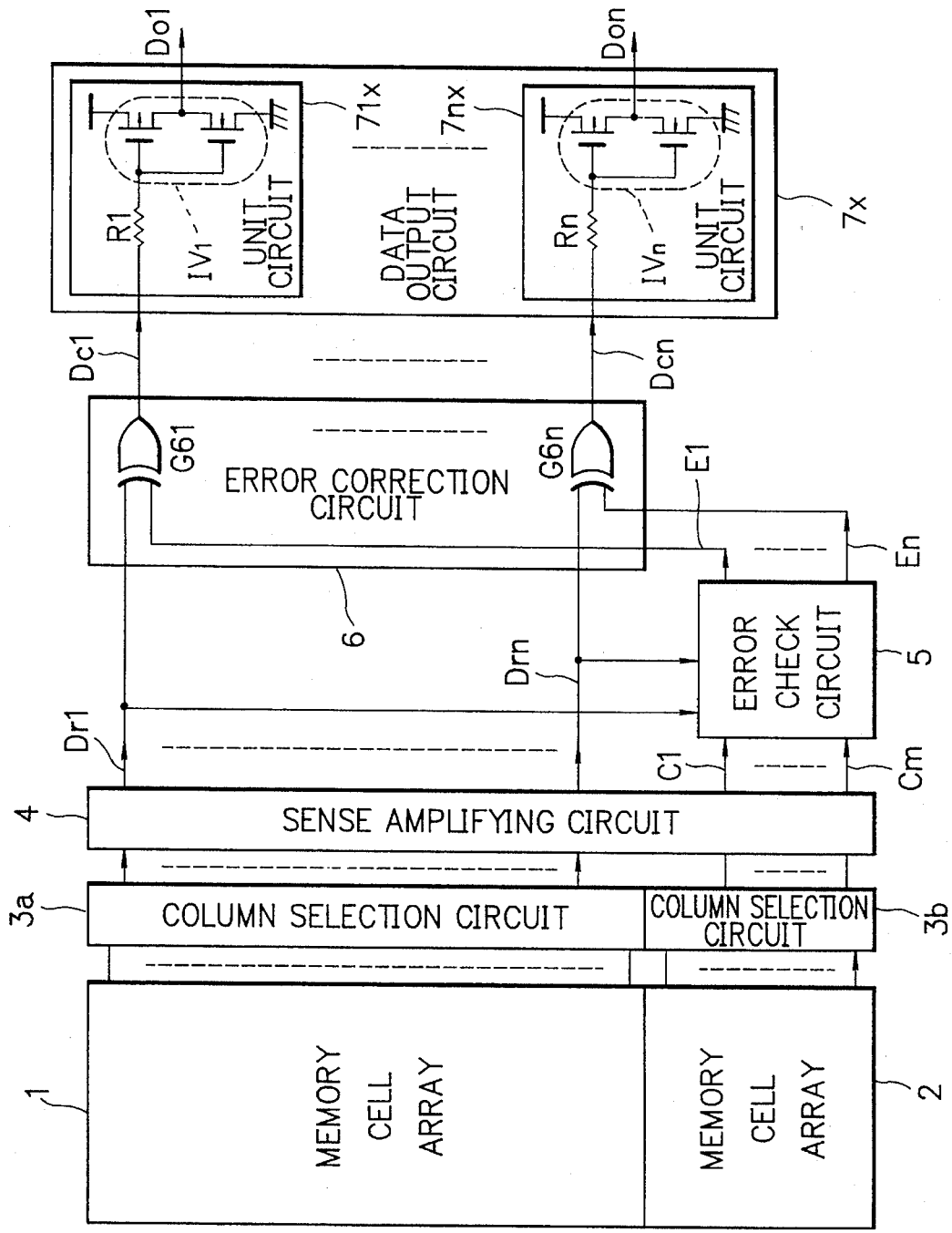
FIG. 1 is a block diagram of a conventional semiconductor memory device.

In FIG. 4, the first memory cell array 1, the second memory cell array 2, the first column selection circuit 3a, the second column selection circuit 3b, the sense amplifying circuit 4, the error check circuit 5 and the error correction circuit 6 have the same constructions as those of the conventional semiconductor memory device shown in FIG. 1.

In the data output circuit 7, each unit circuit 7i includes an identical resistor Ri connected to an input terminal, a first inverter IVi coupled with the resistor Ri in series for performing a buffering amplification of the correct bit Dci input thereto from the error correction circuit 6, a second inverter IV9i for inverting a level of the error check signal Ei input thereto from the error check circuit 5, and a transfer gate TGi which is on-off controlled by an output signal of the second inverter IV9i and a corresponding error check signal Ei so that the transfer gate TGi turns on (i.e. closes) to short-circuit both ends of the resistor Ri when the corresponding error check signal Ei has an active level.

The transfer gate TGi comprises a combination of a p-MOS FET and an n-MOS FET with their gates connected either to an input terminal of the inverter IV9i and the other to an output terminal of the inverter IV9i and with their sources connected to one end of the resistor Ri and drains connected to the other end of the resistor Ri.

In this embodiment, each unit circuit 7i has a power supply current reduction means composed of the resistor Ri and a power supply current reduction cancellation or invalidation means composed of a combination of the second inverter IV9i and the transfer gate TGi for cancelling or invalidating the function of the power supply current reduction means.

Figure 5:
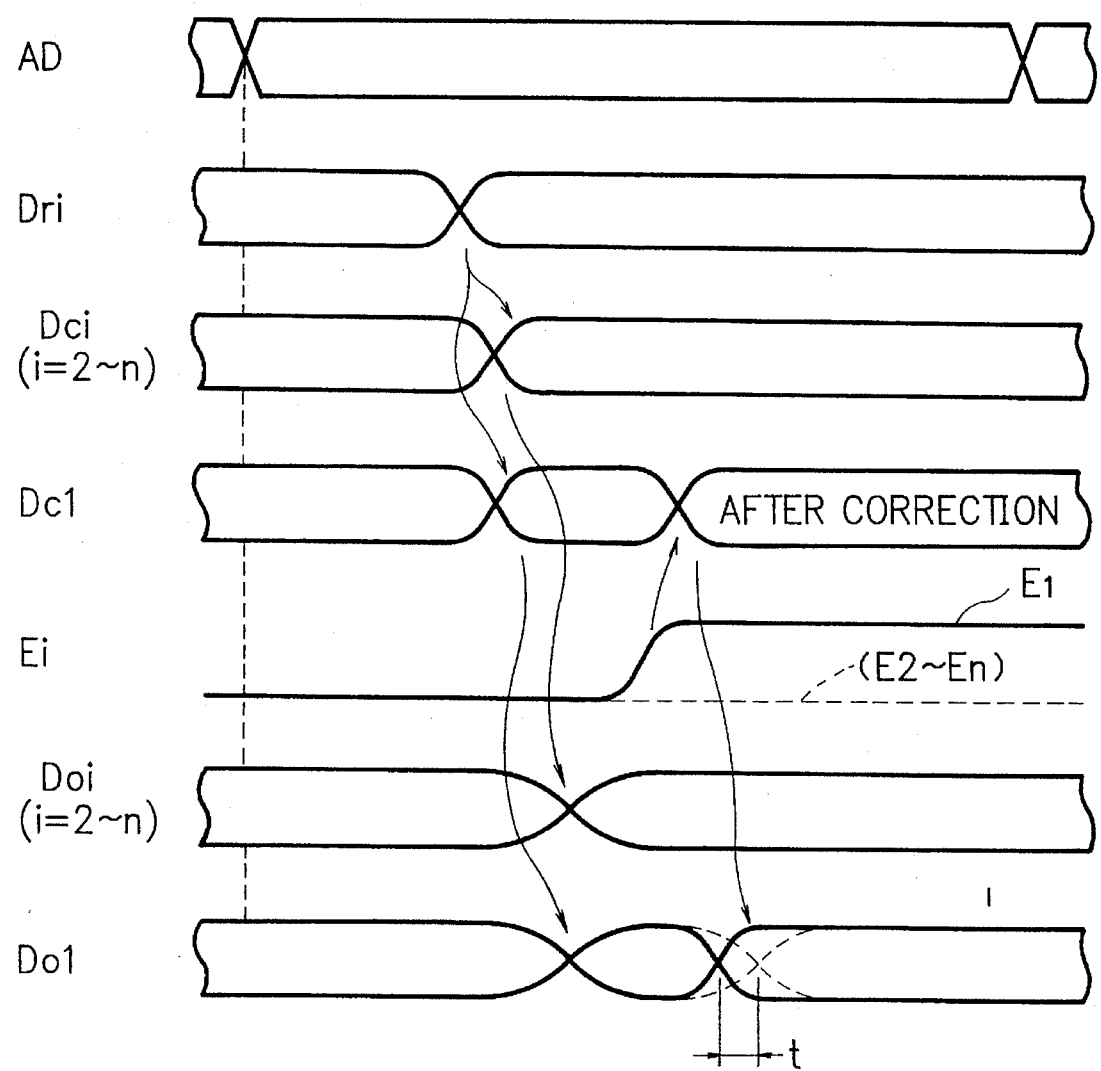
FIG. 5 is a schematic diagram showing waveforms of signals for explaining an operation of the semiconductor memory device shown in FIG. 4.

Next, the operation of the semiconductor memory device will now be described in connection with FIG. 4 and FIG. 5 showing time charts of associated signals.

Figure 2:
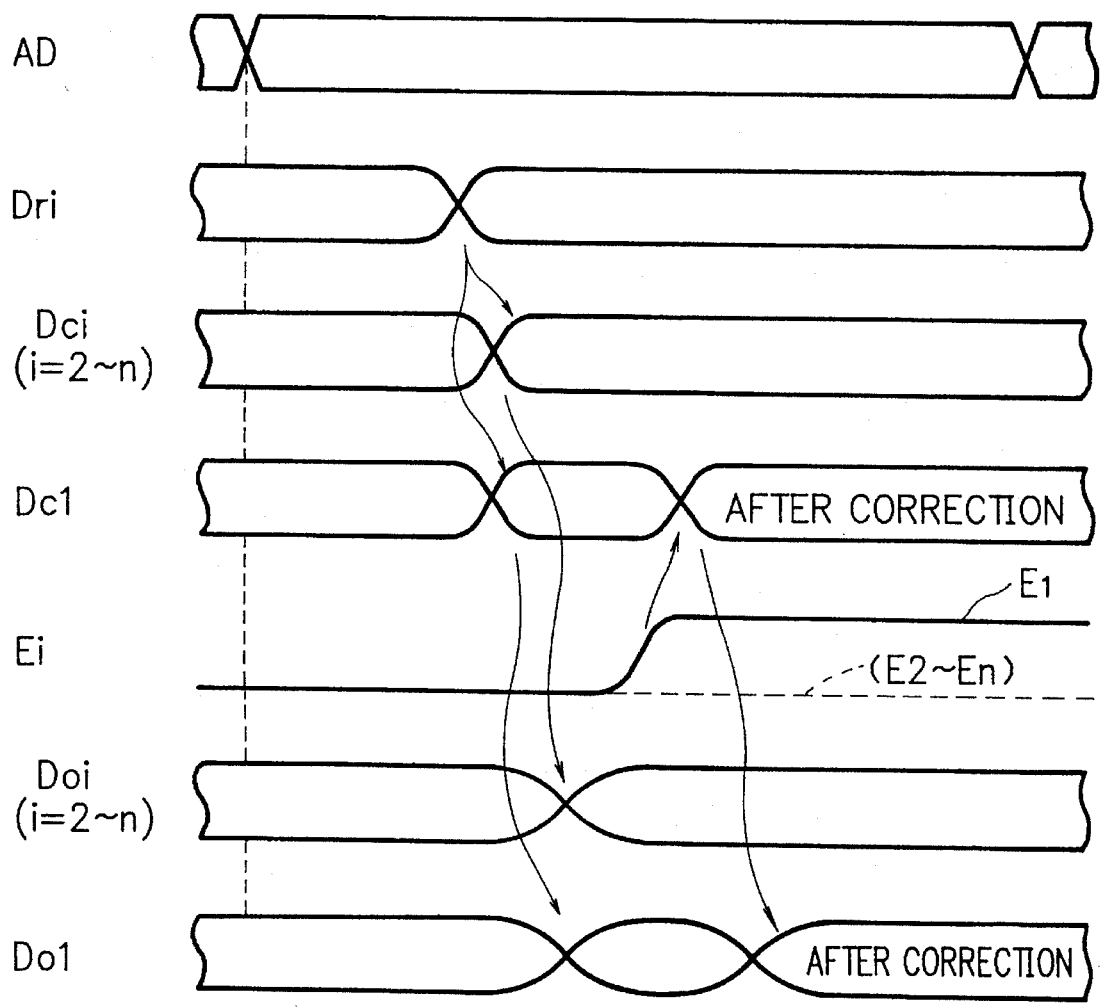
FIG. 2 is a schematic diagram showing waveforms of signals for explaining an operation of the semiconductor memory device shown in FIG. 1.
Figure 3:
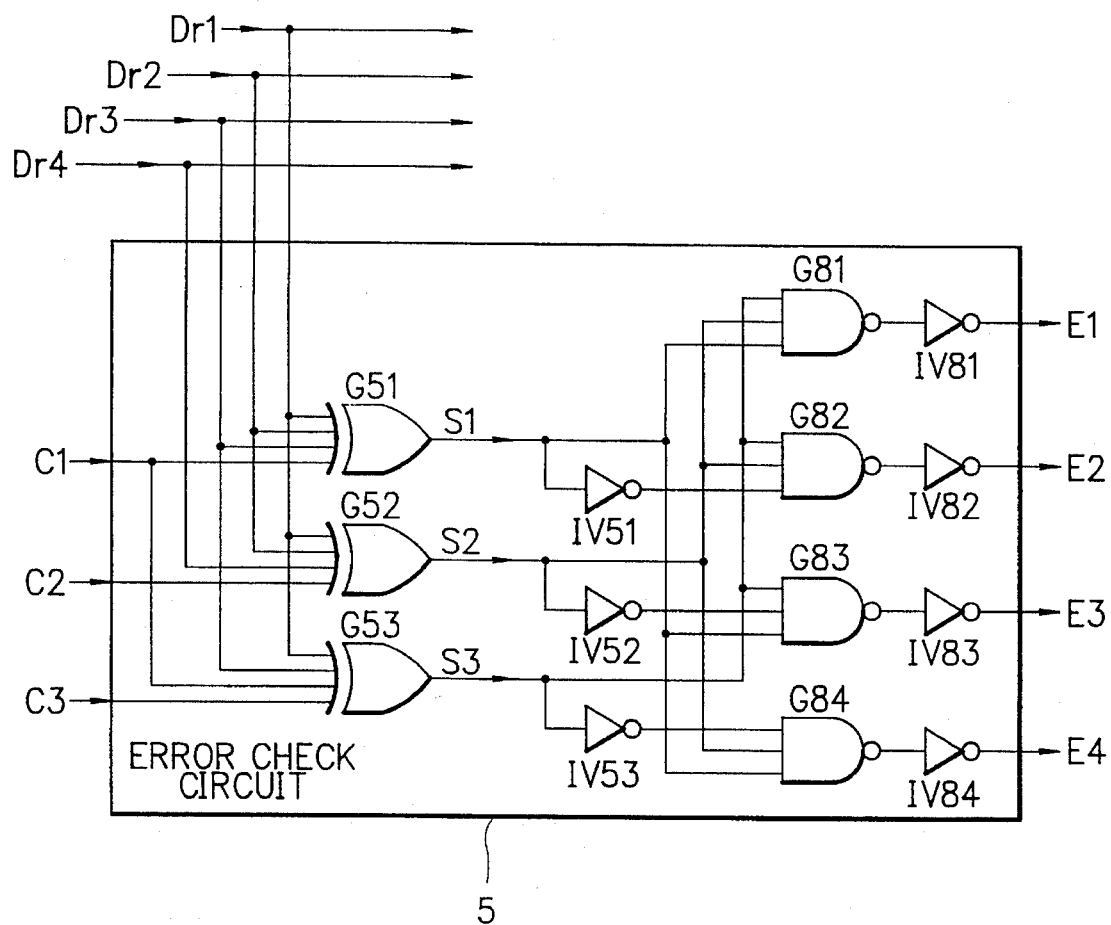
FIG. 3 is a circuit diagram of an error detecting circuit of the semiconductor memory device shown in FIG. 1.

The operations of the first and second memory cell arrays 1 and 2, the first and second column selection circuits 3a and 3b, the sense amplifying circuit 4, the error check circuit 5 and the error correction circuit 6 are the same as those of the conventional semiconductor memory device described with reference to FIGS. 1 and 2.

In this embodiment, the originally correct data (Dc2 to Dcn in FIG. 5) having passed through the error correction circuit 6 as they are without being corrected are input to the respective unit circuit 7i of the data output circuit 7. At this time, the bits corresponding to the error check signals (E2 to En) have an inactive level and thus the transfer gate TGi is off (open). Hence, the data Dci pass through the resistor Ri as the power current reduction means and are then buffer-amplified in the inverter IVi. And the data Doi are output.

On the other hand, the bit (Dc1) corrected in the error correction circuit 6 is also input to the unit circuit 71 of the data output circuit 7. At this moment, the bit corresponding to the error check signal E1 has the active level and hence the transfer gate TG1 is on (closed). The data Dc1 does not pass through the resistor R1 and is directly input to the inverter IV1 via the on-state transfer gate TG1. The data Dc1 is buffer-amplified in the inverter IV1 and the data Do1 is then output. Thus, the time for outputting the data is shortened by a time t (FIG. 5).

Further, even if no data is passed through the resistor R1 of the power current reduction means, the number of bits to be corrected by the error correction circuit 6 in the n-bits is extremely small (for example, one), and at the level change timing of the corrected bit in the unit circuit 7i, a large majority of the other originally correct bits are completed their level change in the unit circuit 7i including the on-state power current reduction means (the resistor Ri). Hence, the power current increase due to the level change of the corrected bit in the unit circuit 7i is extremely small and thus the level change with a fear of a malfunction will never be caused in a power supply line and a ground line.

Figure 6:
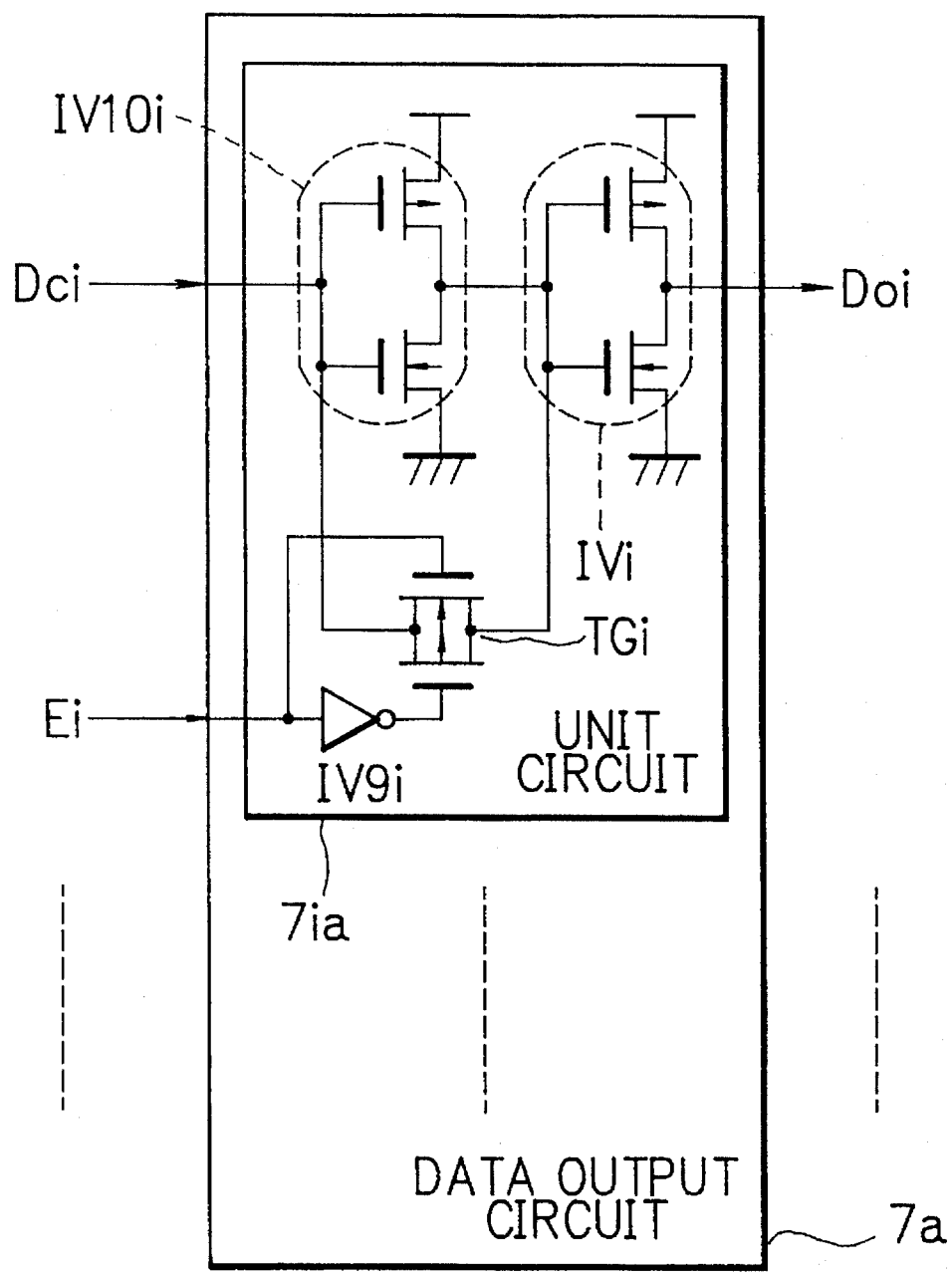
FIG. 6 is a circuit diagram of a data output circuit of a second embodiment of a semiconductor memory device according to the present invention.

In FIG. 6, there is shown a data output circuit of a semiconductor memory device according to a second embodiment of the present invention. Like members to FIG. 4 are designated at like reference characters.

In each unit circuit 7ia of the data output circuit 7a, a third inverter IV10i having a lower current drivability than a first inverter IVi is provided in place of the resistor Ri of the power current reduction means in the first embodiment. In the second embodiment, when an error check signal Ei has an inactive level, a corresponding data bit Dci output from the error correction circuit 6 is sent to the first inverter IVi via the third inverter IV10i to prevent a power supply current increase at the level change. When the error check signal Ei has an active level, the data bit Dci is directly input to the inverter IVi, i.e. not via the third inverter IV10i but via the on-state transfer gate TGi, resulting in a reduced time for outputting the data to an extent that corresponds to a conduction through the third inverter IV10i. The third inverter IV10i has an analogous constitution to the first inverter IVi.

In these embodiments of the present invention, although each unit circuit is further equipped with an invalidation means against the power current reduction means such as the resistor Ri and the third inverter IV10i, similarly, the present invention can be applicable to other power current reduction means.

The error check signal Ei may have an inactive level when a corresponding data bit Dri is erroneous. In that case, each unit circuit 7i may have an additional inverter connected at an input end thereof.

According to the embodiments of the invention, each unit circuit of a data output circuit is equipped with a power current reduction invalidation means which invalidates a power current reduction means when an error check signal corresponding to an error bit has an active level so that a corrected data output from an error correction circuit does not pass through the power current reduction means and is directly input to an output inverter. As a result, the time for outputting the corrected data is reduced by an amount corresponding to a delay at the power current reduction means.

While the present invention has been described with reference to the particular illustrative embodiments it is not to be restricted by those embodiments but only by the appended claims. It is to be appreciated that those skilled in the art can change or modify the embodiments without departing from the scope and spirit of the present invention.

What is claimed is:

1. A semiconductor memory device comprising:

a first memory for storing therein a set of n-bit data, where n is a predetermined integer such that $n \geq 1$;

a second memory for storing therein a set of m-bit data of which a respective one is prepared for use in a checking operation for checking n bits of a corresponding one of the n-bit data for an erroneous bit and a correcting operation for correcting the erroneous bit, where m is a predetermined integer;

a data reading means for reading said respective m-bit data and said corresponding n-bit data;

an error check means for performing the checking operation to provide an error check signal:

an error correction means responsive to the error check signal to perform the correcting operation to provide n correct bits of which a correspondent one to the erroneous bit is corrected; and a data output circuit comprising:
n buffer circuits for performing a buffering amplification of the n correct bits, conducting a power supply current, respectively, a power supply current reduction means for performing a reduction of the power supply current for the buffering amplification of a respective one of the n correct bits, and a current reduction control means responsive to the error check signal to control the reduction of the power supply current for the buffering amplification of the corrected bit.

2. A semiconductor memory device, comprising:

a first memory cell array for storing n-bit data at designated addresses;

a second memory cell array for storing predetermined-bit check bits corresponding to the n-bit data stored in the first memory cell array, at addresses corresponding thereto;

an error check circuit which performs a predetermined logic operation of the n-bit data and the corresponding check bits read out of the first and second memory cell arrays, checks the n-bit data to find an error bit therein and changes a level of a corresponding check bit to an active level to output error check signals;

an error correction circuit for correcting the error bit of the n-bit data according to the error check signals to output a corrected n-bit data; and a data output circuit for performing a buffering amplification of of bits of the corrected n-bit data to output parallel bits of amplified n-bit data, the data output circuit including:
reduction means for reducing a power supply current for the parallel output of the n-bit data; and
invalidation means for invalidating the reduction by the reduction means of the power supply current corresponding to a bit having an active level of the error check signal.

3. The semiconductor memory device of claim 2, wherein the data output circuit includes n unit circuits for processing the n-bit data, each unit circuit including:

an inverter for performing the buffering amplification of the respective data to output the amplified data;

a resistor as the reduction means connected to an input terminal of the inverter for moderating a level change of the input data; and a transfer gate as the invalidation means for short-circuiting the resistor when the bit corresponding to the error check signal has the active level.

4. The semiconductor memory device of claim 2, wherein the data output circuit includes n unit circuits for processing the n-bit data, each unit circuit including:

a first inverter having a first predetermined current drivability for performing the buffering amplification of the respective data to output the amplified data;

a second inverter as the reduction means connected to an input terminal of the first inverter for moderating a level change of the data to be input to the first inverter, the second inverter having a second predetermined current drivability which is lower than the first predetermined current drivability of the first inverter; and a transfer gate as the invalidation means for sending the data, without passing the second inverter, to the first inverter when the bit corresponding to the error check signal has the active level.

5. The semiconductor memory device of claim 2, further comprising:

a first column selection circuit for selecting predetermined n-bit data from the data read out of the first memory cell array:

a second column selection circuit for selecting the check bits corresponding to the n-bit data from the check bits read out of the second memory cell array; and a sense amplifying circuit for detecting the levels of the n-bit data and the check bits corresponding thereto, selected by the first and second column selection circuits and amplifying the detected n-bit data and check bits to output the amplified n-bit data and check bits.

* * * * *